(12) United States Patent
Lee

(10) Patent No.: US 9,093,963 B2
(45) Date of Patent: Jul. 28, 2015

(54) AMPLIFIER AND FILTER HAVING CUTOFF FREQUENCY CONTROLLED ACCORDING TO DIGITAL CODE

(71) Applicant: Samsung Electronics Co. Ltd., Suwon-si, Gyeonngi-do (KR)

(72) Inventor: Jong-Woo Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 13/777,599

(22) Filed: Feb. 26, 2013

(65) Prior Publication Data

US 2013/0293305 A1    Nov. 7, 2013

(30) Foreign Application Priority Data

May 4, 2012  (KR) .................. 10-2012-0047612

(51) Int. Cl.
*H03F 1/34* (2006.01)
*H03F 3/45* (2006.01)

(52) U.S. Cl.
CPC .............. *H03F 3/45076* (2013.01); *H03F 1/34* (2013.01); *H03F 3/45475* (2013.01); *H03F 2200/405* (2013.01); *H03F 2203/45512* (2013.01); *H03F 2203/45514* (2013.01); *H03F 2203/45522* (2013.01); *H03F 2203/45528* (2013.01); *H03F 2203/45591* (2013.01); *H03F 2203/45594* (2013.01)

(58) Field of Classification Search
CPC ........................................................ H03F 1/34
USPC ...................................... 330/69, 86, 109, 282
See application file for complete search history.

(56) References Cited

U.S. PATENT DOCUMENTS

| 3,643,173 | A | * | 2/1972 | Whitten ......................... 330/253 |
| 4,868,516 | A | | 9/1989 | Henderson et al. |
| 2012/0194203 | A1 | * | 8/2012 | Osawa .......................... 324/663 |
| 2013/0154738 | A1 | * | 6/2013 | Lee ............................... 330/254 |

FOREIGN PATENT DOCUMENTS

| JP | 2003-204487 A | 7/2003 |
| KR | 10-2003-0026828 A | 4/2003 |
| KR | 10-2010-0071867 A | 6/2010 |
| KR | 10-2012-0010378 | 2/2012 |
| KR | 10-2012-0011002 A | 2/2012 |

* cited by examiner

*Primary Examiner* — Steven J Mottola
(74) *Attorney, Agent, or Firm* — Jefferson IP Law, LLP

(57) ABSTRACT

An amplifier circuit is provided. The amplifier circuit includes an operational amplifier, a feedback resistor for changing gain and cutoff frequency characteristics of the operational amplifier, and a feedback variable capacitor for changing the cutoff frequency characteristics of the operational amplifier, wherein a capacitance of the feedback variable capacitor increases exponentially according to a digital control code, and the cutoff frequency of the operational amplifier is inversely proportional to the capacitance of the feedback variable capacitor and varies linearly on a logarithmic scale.

12 Claims, 6 Drawing Sheets

AMPLIFIER AND FILTER HAVING CUTOFF FREQUENCY CONTROLLED ACCORDING TO DIGITAL CODE

PRIORITY

This application claims priority under 35 U.S.C. §119 of a Korean patent application filed on May 4, 2012 in the Korean Intellectual Property Office and assigned Serial No. 10-2012-0047612, the entire disclosure of which is hereby incorporated by reference.

BACKGROUND OF THE INVENTION

1. Field of the Invention

The present invention relates to an analog amplifier and analog filter for amplifying an analog signal. More particularly, the present invention relates to an amplifier and filter having a cutoff frequency controlled according to a digital control code.

2. Description of the Related Art

FIG. 1 illustrates a configuration of an analog filter according to the related art.

Referring to FIG. 1, an analog filter is configured by combining a plurality of filter stages 100 of a first or higher order. A high-pass feedback stage 110 is connected between a first amplifier stage and an (n−1)th amplifier stage, and removes a noise included in a Direct Current (DC) component and a DC offset.

Each of the filter stages 100 includes an operational amplifier, a variable resistor, and a variable capacitor, and the gain and cutoff frequency thereof are controlled by the variable resistor and the variable capacitor. That is, the gain of each filter stage 100 is determined by a ratio of an input resistance to a feedback resistance, and the cutoff frequency is inversely proportional to a product of a feedback resistance and a feedback capacitance.

The variable resistor of each filter stage 100 may include two or more segments each configured by combining short switches and a plurality of resistors, and the short switches are controlled by a digital code. The digitally controlled serial resistor connection has a binary structure in which the number of resistors increases, such as 2R, 4R, 8R, 16R, ..., 2nR (where n is an integer), and the total resistance is linearly proportional to the digital code. The resistance of the variable resistors varies linearly according to the digital code K, and the cutoff frequency is proportional to a reciprocal of the resistance.

Alternatively, the variable capacitor of each filter stage 100 may include two or more capacitor segments each configured by combining short switches and capacitors in order to variably change the cutoff frequency, and the short switches may be controlled by a digital code. For example, the digitally controlled parallel capacitor connection has a binary structure in which the number of the capacitors increases, such as 2C, 4C, 8C, 16C, ..., 2nC, and the total capacitance of the capacitors is linearly proportional to the digital code. The total capacitance of the variable capacitors varies linearly according to the digital code K, and the cutoff frequency is proportional to the reciprocal of the capacitance.

Generally, a frequency axis is represented on a logarithmic scale in the frequency domain, and a decibel (dB) unit representing a gain has a logarithmic scale value. Accordingly, a variable resistance or capacitance, which varies linearly according to the digital code K, has nonlinear characteristics, and thus reduces efficiency.

That is, as the value of the digital code K increases, the variable resistance or capacitance varies rapidly on the logarithmic scale, whereas as the value of the digital code K increases, the variable resistance or capacitance varies slowly on the logarithmic scale. This reduces the accuracy of the variable resistance or capacitance upon operation at high frequency bands as illustrated in FIG. 2, causing uncontrollable intervals as well as the reduction of efficiency.

FIG. 2 is a graph illustrating a relation between a frequency and a gain according the related art.

As the value of the digital code K increases, the variable resistance or capacitance varies slowly on the logarithmic scale, whereas as the value of the digital code K increases, the variable resistance or capacitance varies rapidly on the logarithmic scale, causing intervals in which the cutoff frequency is uncontrollable.

Also, when the frequency change widths of respective digital codes are measured, the change widths are inconsistent due to quantization errors of respective change intervals as illustrated in FIG. 3, so that uncontrollable intervals occur even though the frequency axis is considered linearly rather than on the logarithmic scale.

FIG. 3 is a graph illustrating a relation between a digital control code and a frequency according the related art.

Accordingly, there is a need for a filter and amplifier having a cutoff frequency conveniently controlled exponentially according to a digital code.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a variable cutoff frequency filter circuit, the cutoff frequency of which can be finely defined even at a high frequency band which is frequently used.

Another aspect of the present invention is to provide an analog circuit that can be intuitively understood by a user that is accustomed to the processing of the log value of a cutoff frequency.

Yet another aspect of the present invention is to provide a variable capacitor circuit, the total capacitance of which increases exponentially as the value of a control code increases.

In accordance with an aspect of the present invention, an amplifier circuit is provided. The amplifier circuit includes an operational amplifier, a feedback resistor for changing gain and cutoff frequency characteristics of the operational amplifier, and a feedback variable capacitor for changing the cutoff frequency characteristics of the operational amplifier, wherein a capacitance of the feedback variable capacitor increases exponentially according to a digital control code, and the cutoff frequency of the operational amplifier is inversely proportional to the capacitance of the feedback variable capacitor and varies linearly on a logarithmic scale.

In accordance with another aspect of the present invention, an amplifier circuit is provided. The amplifier circuit includes a logic circuit for performing logic operations on a digital control code, a feedback capacitor having a capacitance varying according to a digital output signal of the logic circuit, and an operational amplifier having cutoff frequency characteristics inversely proportional to the capacitance of the feedback capacitor, wherein a cutoff frequency of the operational amplifier is inversely proportional to the capacitance of the feedback variable capacitor and varies linearly on a logarithmic scale.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, an apparatus and method are provided for implementing an amplifier and a filter having a cutoff frequency controlled exponentially according to a digital control code according to exemplary embodiments of the present invention.

Figure 1:
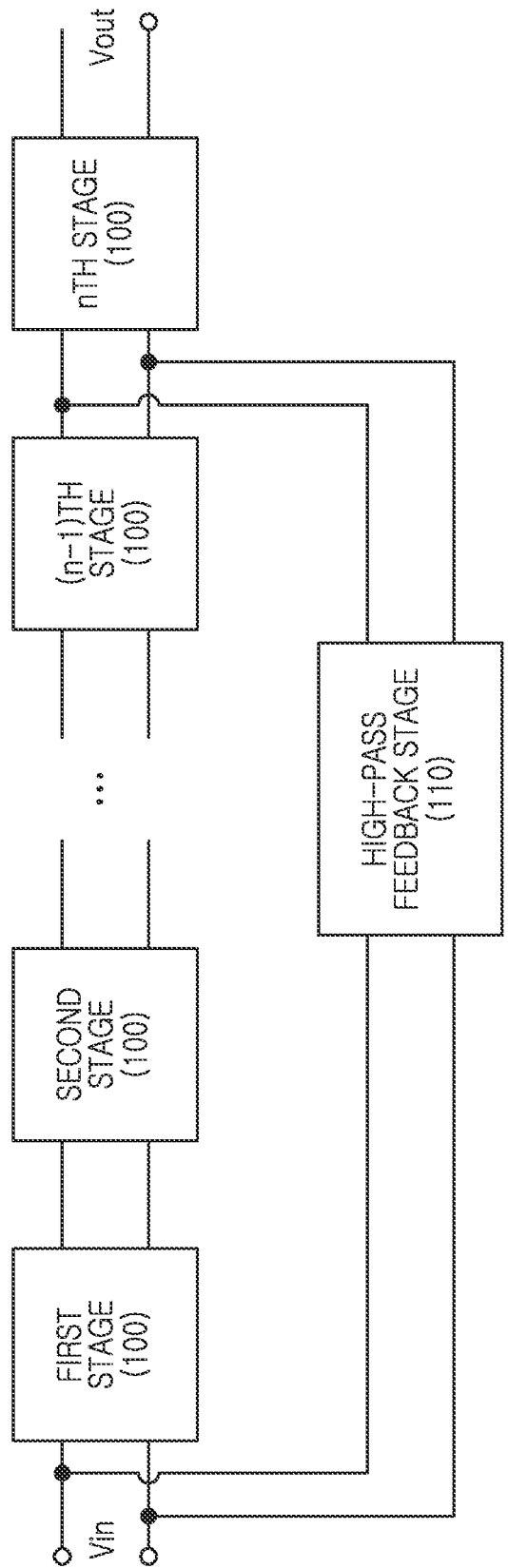
FIG. 1 illustrates a configuration of an analog filter according to the related art.
Figure 2:
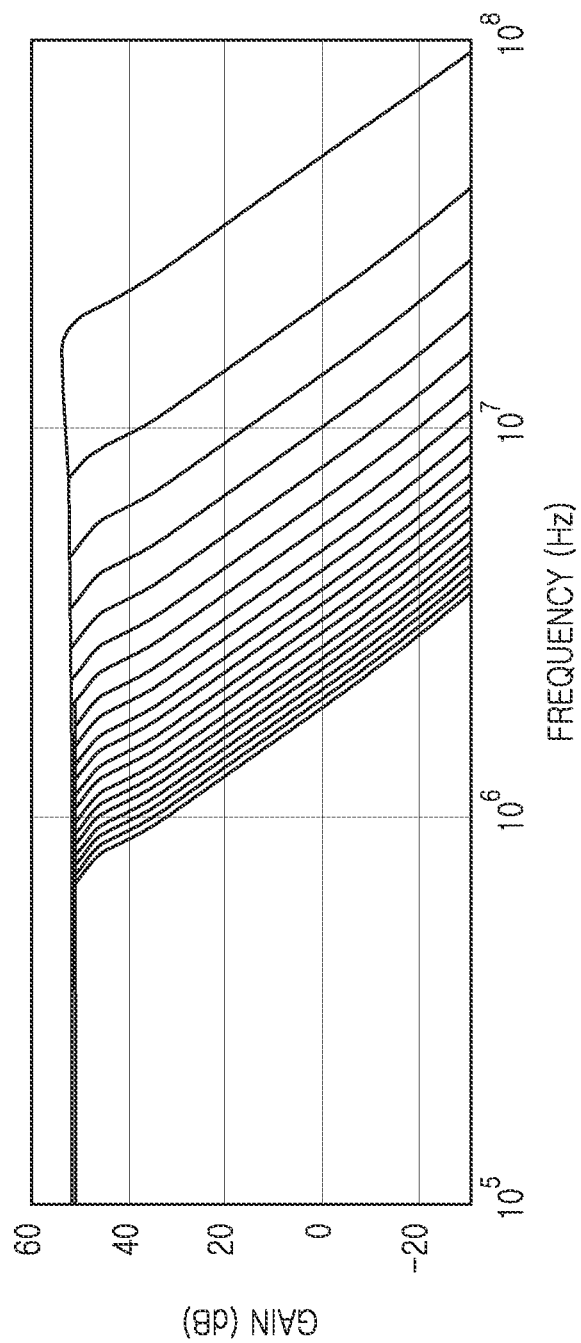
FIG. 2 is a graph illustrating a relation between a frequency and a gain according the related art.
Figure 3:
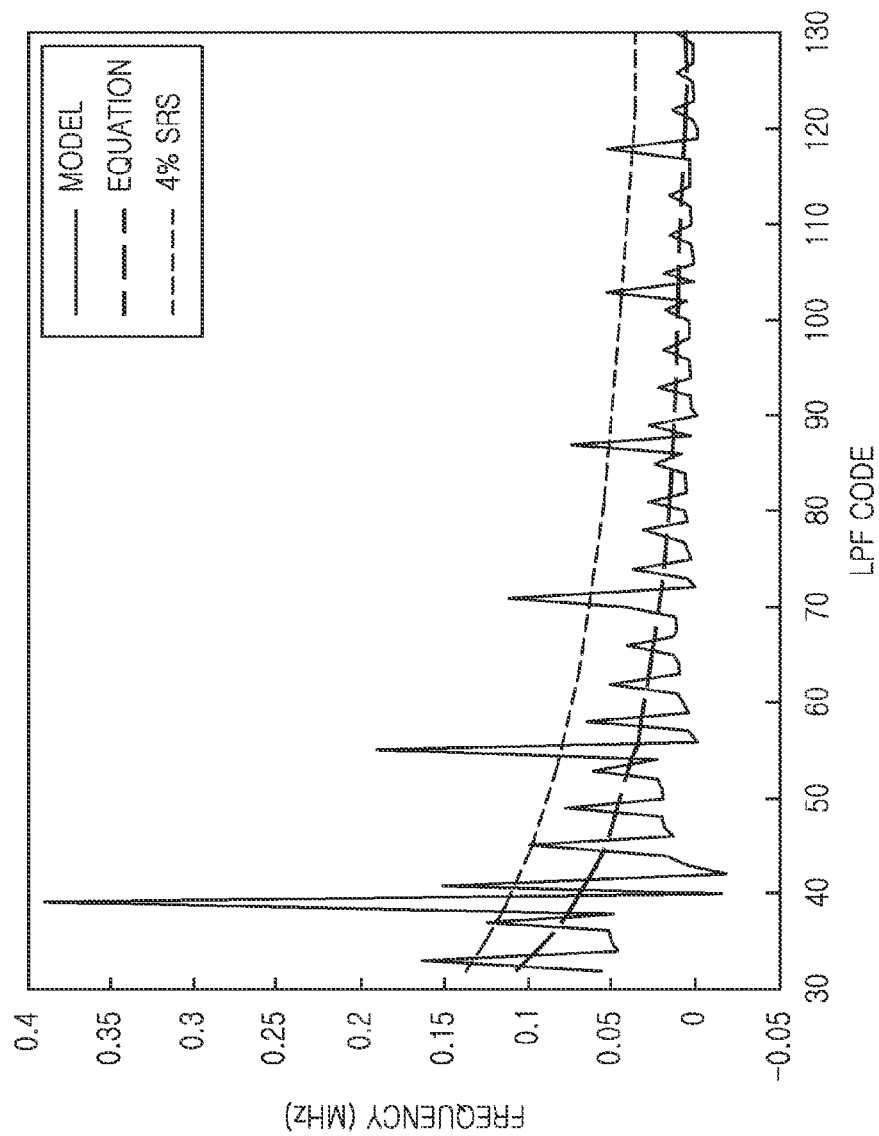
FIG. 3 is a graph illustrating a relation between a digital control code and a frequency according the related art.
Figure 4:
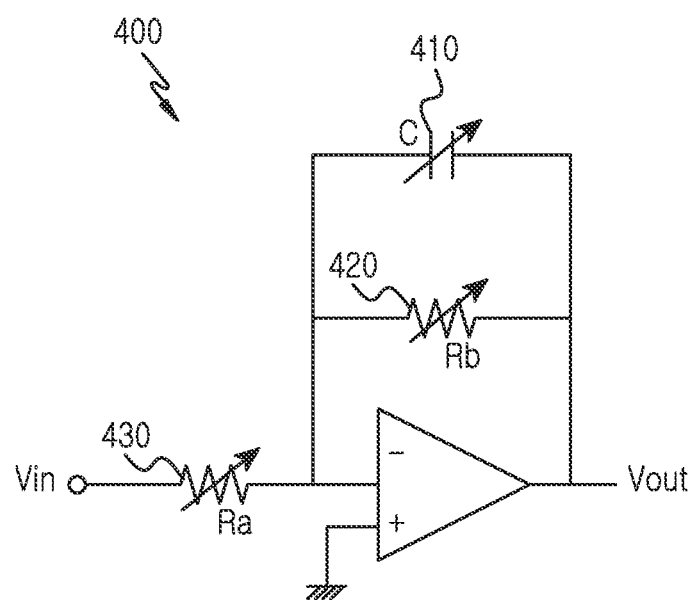
FIG. 4 is a circuit diagram illustrating an amplifier using a variable capacitor according to an exemplary embodiment of the present invention.

FIG. 4 is a circuit diagram illustrating an amplifier using a variable capacitor according to an exemplary embodiment of the present invention.

Referring to FIG. 4, an amplifier 400 may change a cutoff frequency by modifying a capacitance value of a feedback variable capacitor 410. According to another exemplary embodiment, the amplifier 400 may change a gain value and a cutoff frequency by modifying resistance values of feedback variable resistor 420 and input variable resistor 430. While each of the feedback variable capacitor 410, the feedback variable resistor 420, and the input variable resistor 430 are described herein as being variable, one or more of the feedback variable capacitor 410, the feedback variable resistor 420, and the input variable resistor 430 may be non-variable.

The gain value and the cutoff frequency value in the direct current of the amplifier are defined based on the following Equation (1):

$$\text{Gain} = \frac{R_b}{R_a}, f_c = \frac{1}{2\pi R_b C} \qquad \text{Equation (1)}$$

where $R_a$ is the resistance of the input variable resistor 430, $R_b$ is the resistance of the feedback variable resistor 420, and C is the capacitance of the feedback variable capacitor 410.

According to the exemplary embodiments of the present invention, the following procedures are used to change the cutoff frequency on a logarithmic scale linearly (linear in dB) while obtaining a uniform gain value. The ideal capacitance value of the feedback variable capacitor 410 which allows for a desired cutoff frequency is calculated, and a value closest to an ideal capacitance value is calculated among values which can be provided by the feedback variable capacitor 410 and is set to C. A detailed structure of the feedback variable capacitor 410 will be described below with reference to FIG. 5.

The ideal resistance value of the input variable resistor 430 which enables the gain value to be maintained uniformly is calculated, and a value closest to an ideal resistance value is calculated among values which can be provided by the input variable resistor 430 and is set to $R_a$.

Figure 5:
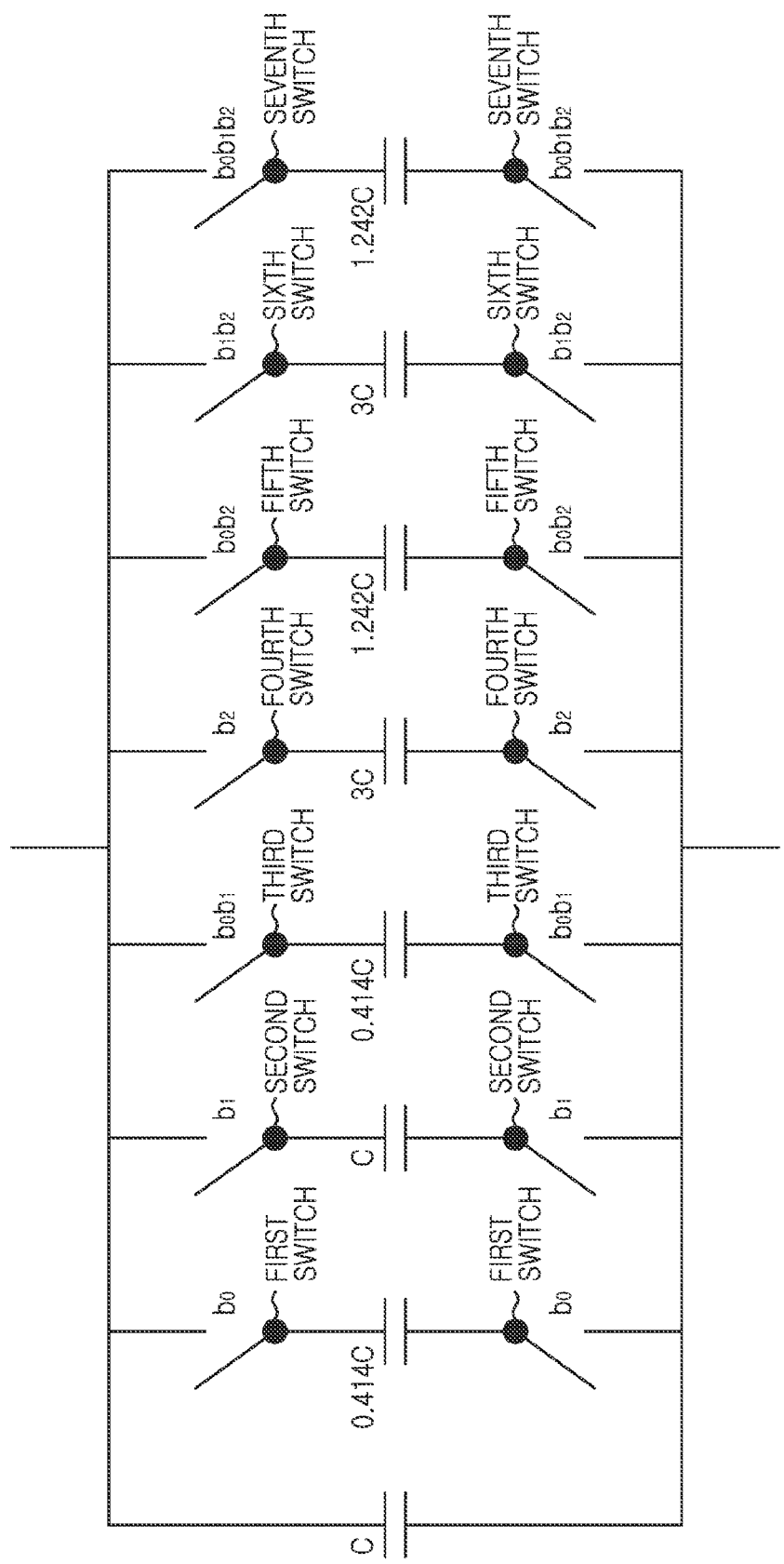
FIG. 5 is a circuit diagram illustrating a variable capacitor according to an exemplary embodiment of the present invention

FIG. 5 illustrates a variable capacitor controlled exponentially according to an exemplary embodiment of the present invention.

Referring to FIG. 5, the variable capacitor includes a plurality of capacitor segments, and switches for controlling the connection states of the parallel-connected capacitor segments. Here, while two switches are shown for each of the plurality of capacitor segments, one switch may alternately be employed.

For example, the capacitance of the variable capacitor is determined by a 3-bit control code ($b_0 b_1 b_2$). The variable capacitor includes a first capacitor segment including only a unit capacitor C, a second capacitor segment including a capacitor of 0.414C times and a first switch, a third capacitor segment including a unit capacitor and a second switch, a fourth capacitor segment including a capacitor of 0.414C times and a third switch, a fifth capacitor segment including a capacitor of 3C times and a fourth switch, a sixth capacitor segment including a capacitor of 1.242C times and a fifth switch, a seventh capacitor segment including a capacitor of 3C times and a sixth switch, and an eighth capacitor segment including a capacitor of 1.242C times and a seventh switch, which are connected in parallel.

Herein, the first switch is closed by the first bit ($b_0$) of the 3-bit digital code, the second switch is closed by the second bit ($b_1$) of the 3-bit digital code, and the fourth switch is closed by the third bit ($b_2$) of the 3-bit digital code. The third switch is closed by the result of AND operation of the first bit ($b_0$) and second bit ($b_1$) of the 3-bit digital code, the fifth switch is closed by the result of AND operation of the first bit ($b_0$) and third bit ($b_2$) of the 3-bit digital code, the sixth switch is closed by the result of AND operation of the second bit ($b_1$) and third bit ($b_2$) of the 3-bit digital code, and the seventh switch is closed by the result of AND operation of the first bit ($b_0$), second bit ($b_1$) and third bit ($b_2$) of the 3-bit digital code.

In general cases, with respect to the digital code k, the total capacitance is generalized by the following Equation (2):

$$C_{total} = C_0 \cdot 2^{\frac{k}{2^N}Z} \quad \text{Equation (2)}$$

where $C_0$ is the capacitance of a unit capacitor when the digital code is 0, N is the number of bits representing the digital code, and Z is a compression constant determining the capacitance difference between two digital codes. For example, the compression constant Z becomes Z=4 when the difference between the capacitance at the first digital code and the capacitance at the second digital code is determined as $\sqrt{2}$ times. Therefore, in order to implement a variable frequency filter, the capacitance of which increases in the unit (=3 dB unit) of $\sqrt{2}$ times using a 3-bit digital code, the capacitance values are respectively set to 0.414 times, 1 times, 0.414 times, 3 times, 1.242 times, 3 times, 1.242 times of the unit capacitor C.

In this exemplary embodiment of the present invention, N is set to 3 (N=3) and Z is set to 4 (Z=4).

When the input digital code is 0 ($b_2b_1b_0$=000), the unit capacitor of the upper stage is only activated, so that the total capacitance becomes C. In this case, the first to seventh switches are all in the off state.

When the digital code is 1 ($b_2b_1b_0$=001), connection is accomplished through the switch $b_0$, so that the total capacitance becomes 1.414C (=C+0.414). In this case, only the first switch is turned on and the other switches are all turned off.

When the digital code is 2 (b2b1b0=010), the switch $b_1$ is turned on, so that the total capacitance becomes 2C (=C+C). In this case, only the second switch is turned on and the rest of the switches are all turned off.

When the digital code is 3 (b2b1b0=011), the switches $b_0$ and $b_1$ are all turned on, so that the total capacitance becomes 2.828C (=C+0.414C+C+0.414C). In this case, the first switch, second switch and third switch are turned on and the fourth to seventh switches are turned off. The third switch is switched according to the result of an AND operation of the first bit ($b_0$) and the second bit ($b_1$). For example, the third switch is turned on only when $b_0$ and $b_1$ are all 1.

When the digital code is 4 ($b_2b_1b_0$=100), the switch $b_2$ is turned on, so that the total capacitance becomes 4C (=C+3C). In this case, only the fourth switch is turned on and the other switches are turned off.

When the digital code is 5 ($b_2b_1b_0$=101), the switches $b_0$ and $b_2$ are turned on, so that the total capacitance becomes 5.656C (=C+0.414C+3C+1.242C). In this case, only the first and fourth switches are turned on and the other switches are turned off.

When the digital code is 6 ($b_2b_1b_0$=110), the switches $b_0$ and $b_2$ are turned on, so that the total capacitance becomes 8C (=C+C+3C+3C). In this case, the second, fourth and sixth switches are turned on and the other switches are turned off. The sixth switch is switched according to the result of an AND operation of the second bit ($b_1$) and the third bit ($b_2$). For example, the sixth switch is turned on only when $b_1$ and $b_2$ are all 1.

When the digital code is 7 ($b_2b_1b_0$=111), the switches are all turned on, so that the total capacitance becomes 11.314C (=C+0.414C+C+0.414C+3C+1.242C+3C+1.242C). In this case, the first to seventh switches are all turned on. In this case, the seventh switch is switched according to the result of an AND operation of the first bit ($b_0$), second bit ($b_1$) and the third bit ($b_2$). For example, the seventh switch is turned on only when $b_0$, $b_1$ and $b_2$ are all 1.

In order to represent this relationship in an equation, when the total capacitance is developed in a Taylor series and $b_{2N}$=$b_2$, $b_{1N}$=$b_1$ and $b_{0N}$=$b_0$ are applied thereto based on the understanding that $b_2$, $b_1$ and $b_0$ are all 1 or 0, the relation can be expressed as Equation (3).

$$\begin{aligned} C_{total} &= C \times 2^{KZ/2^N} = C \times 2^{(4\times b2 + 2 \times b1 + b0)Z/2^N} \quad \text{Equation (3)} \\ &= C \times (1 + k \cdot \ln 2 \cdot Z/2^N + (k \cdot \ln 2 \cdot Z/2^N)^2/2! + (k \cdot \ln 2 \cdot Z/2^N)^3/3! + \\ &= C(1 + 0.414 \times b0 + 1 \times b1 + 0.414 \times b0b1) \times (1 + 3 \times b2) \end{aligned}$$

As in Equation (2), when a capacitor bank increases exponentially, the reciprocal of the square root of the capacitance of the capacitor bank has also exponential characteristics. As a result, in order to have linearity on the logarithmic scale, the capacitor bank increases and decreases exponentially according to the digital code.

Although the exemplary embodiments of the present invention have been described with respect to a case where the bit number of the digital control code is a 3-bit number, the bit number of the digital control code may be extended to N bits.

Figure 6:
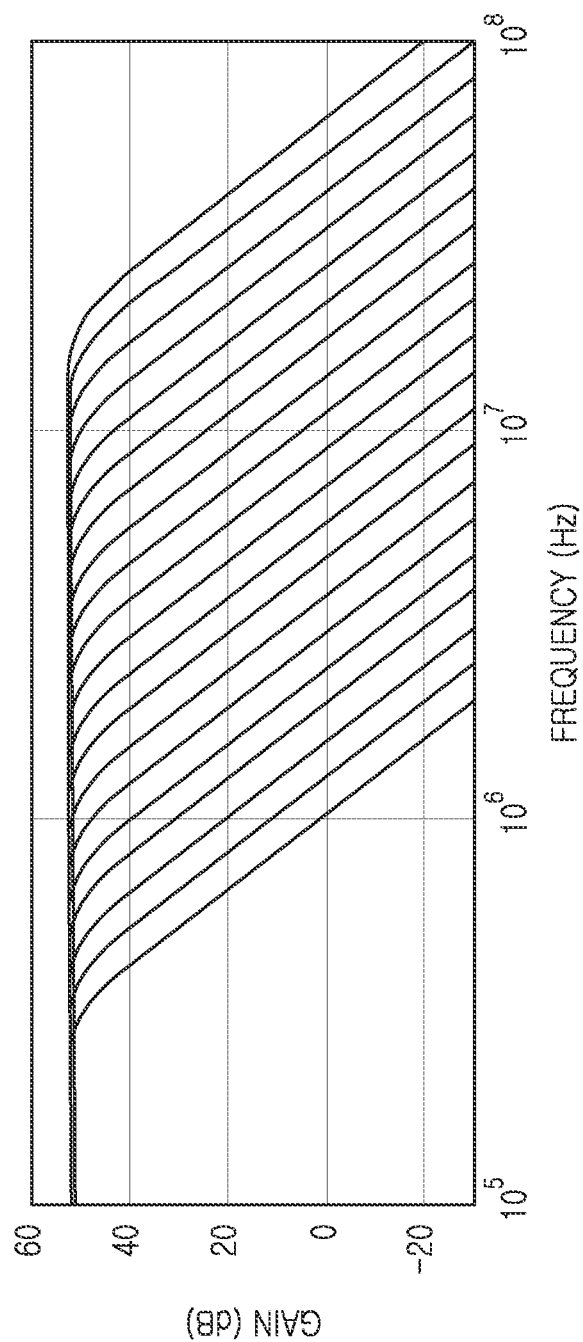
FIG. 6 is a graph illustrating a relation between a frequency, a gain and a digital control code K according to an exemplary embodiment of the present invention.

FIG. 6 is a graph illustrating a relation between a frequency, a gain and a digital control code K according to an exemplary embodiment of the present invention.

Referring to FIG. 6, it can be seen that uniform intervals are maintained on the logarithmic scale by controlling a cutoff frequency and a gain exponentially according to the digital control code K. This enables fine control of the cutoff frequency, thus improving a filter performance as well as increasing system efficiency.

As described above, exemplary embodiments of the present invention provide a variable capacitor and a variable cutoff frequency filter circuit in which the cutoff frequency of the variable cutoff frequency filter can be finely defined, even at a high frequency band which is frequently used.

Also, exemplary embodiments of the present invention provide an analog circuit that can be intuitively understood by a user that is accustomed to the processing of the log value of a cutoff frequency.

Therefore, exemplary embodiments of the present invention can remove a complex logic circuit used to obtain an approximate value in the existing binary variable capacitor to simplify a digital control unit, which reduces a total circuit area to reduce a unit circuit cost, and reduce a noise generated in a digital logic circuit to thereby increase filter performance.

For this, exemplary embodiments of the present invention provide a variable capacitor circuit, the cutoff frequency of which decreases exponentially as the value of a control code increases.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An amplifier comprising:
   an operational amplifier; and
   a feedback variable capacitor configured to control a cutoff frequency of the operational amplifier,
   wherein the feedback variable capacitor comprises,
   a plurality of capacitor segments arranged in parallel; and
   a plurality of switch segments configured to control connection states of each of the plurality of capacitor segments,
   wherein the feedback variable capacitor provides one of candidate capacitances based on the connection states, and
   wherein the candidate capacitances have a substantially exponential distribution.

2. The amplifier of claim 1, when the candidate capacitances which are provided by the feedback variable capacitor are arranged in an order of size, the candidate capacitances forms a geometric progression.

3. The amplifier of claim 1, wherein the connection states are controlled based on a control code.

4. The amplifier of claim 3, wherein a portion of the plurality of the switch segments is directly controlled based on a control code, and
   the rest of the plurality of the switch segments is controlled based on at least one logic operation between at least two bits of the control code.

5. The amplifier of claim 1, wherein the feedback variable capacitor includes:
   a primary capacitor segment; and
   a plurality of secondary capacitor segments;
   wherein each of the plurality of switch segments switches so as to respectively connect one of the plurality of secondary capacitor segments.

6. The amplifier of claim 5, wherein the capacitance of the feedback variable capacitor is controlled according to the control code and is determined from a geometric progression of capacitance values corresponding respectively to the first capacitor segment and the plurality of second capacitor segments.

7. The amplifier of claim 1, further comprising:
   an input resistor coupled to an input terminal of the operational amplifier; and
   a feedback resister coupled to the feedback variable capacitor in parallel.

8. The amplifier of claim 7, wherein a gain of the operational amplifier is determined by a ratio of a resistance of the feedback resistor to an input resistance.

9. The amplifier of claim 7, wherein the cutoff frequency of the operational amplifier is inversely proportional to a product of a resistance of the feedback resistor to a capacitance of the feedback variable capacitor.

10. The amplifier of claim 1, wherein at least one of the candidate capacitances is provided by a combination of at least two capacitor segments among the plurality of the capacitor segments.

11. The amplifier of claim 3, wherein a capacitance of the variable capacitor is substantially exponentially increased by linearly increasing a value of the control code.

12. The amplifier of claim 1, wherein the cutoff frequency is substantially exponentially increased by substantially exponentially increasing the capacitance of the variable capacitor.

* * * * *